(12) United States Patent
Kandala et al.

(10) Patent No.: US 9,680,474 B1
(45) Date of Patent: Jun. 13, 2017

(54) SYSTEM AND METHOD TO REDUCE FOOTPRINT AND IMPROVE YIELD OF FABRIC MUXES IN PROGRAMMABLE LOGIC DEVICES

(71) Applicant: Xilinx, Inc., San Jose, CA (US)

(72) Inventors: Anil Kumar Kandala, Hyderabad (IN); Srinivasa L. Karumajji, Hyderabad (IN); Santosh Yachareni, Hyderabad (IN); Sandeep Vundavalli, Secunderabad (IN); Udaya Kumar Bobbili, Karim Nagar (IN); Golla V S R K Prasad, Guntur (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/073,389

(22) Filed: Mar. 17, 2016

(51) Int. Cl.
*H03K 19/173* (2006.01)
*H03K 19/177* (2006.01)

(52) U.S. Cl.
CPC ..... *H03K 19/1737* (2013.01); *H03K 19/1776* (2013.01)

(58) Field of Classification Search
CPC ............... H03K 19/1737; H03K 19/1776
USPC ................................. 326/38, 41, 47
See application file for complete search history.

(56) References Cited

U.S. PATENT DOCUMENTS

| 7,053,654 | B1 * | 5/2006 | Young | H03K 19/1737 326/113 |
| 7,683,664 | B1 * | 3/2010 | Gaide | H03K 17/005 326/113 |

* cited by examiner

*Primary Examiner* — Daniel D Chang
(74) *Attorney, Agent, or Firm* — Gerald Chan

(57) ABSTRACT

An interconnect element includes: a selection circuit for receiving input signals and having a selection output; a half-latch circuit having an input coupled to the selection output, wherein the half latch circuit comprises a pull-up device; and a common bias circuit coupled to the pull-up device, wherein the common bias circuit is configured to supply a tunable bias voltage to the pull-up device.

16 Claims, 6 Drawing Sheets

SYSTEM AND METHOD TO REDUCE FOOTPRINT AND IMPROVE YIELD OF FABRIC MUXES IN PROGRAMMABLE LOGIC DEVICES

TECHNICAL FIELD

An embodiment described herein relates generally to programmable logic devices, and in particular, to an interconnect network for a programmable logic device.

BACKGROUND

Programmable logic devices (PLDs) exist as a well-known type of integrated circuit that may be programmed by a user to perform specified logic functions. One type of PLDs is known as a field programmable gate array (FPGA). The FPGA typically includes an array of programmable tiles. These programmable tiles comprise programmable logic, programmable interconnect, and an input/output (I/O) circuitry. The programmable logic implements the logic of a user design using multiple programmable elements, known as logic elements (LEs) or combinational logic blocks (CLBs). Connectivity between programmable elements is achieved through the programmable interconnect. The programmable interconnect may include a large number of interconnect lines of varying lengths interconnected by programmable interconnect points (PIP). In addition, the I/O circuitry provides incoming signals to the programmable elements and presents outgoing signals generated by the programmable logic. The programmable logic, interconnect and I/O circuitry can be programmed/configured to support different signal-processing applications. Circuit technologies, such as SRAM, antifuse and flash, have been used for configuring an FPGA.

SUMMARY

An interconnect element includes: a selection circuit for receiving input signals and having a selection output; a half-latch circuit having an input coupled to the selection output, wherein the half latch circuit comprises a pull-up device; and a common bias circuit coupled to the pull-up device, wherein the common bias circuit is configured to supply a tunable bias voltage to the pull-up device.

Optionally, the selection circuit comprises a multiplexer.

Optionally, the half-latch circuit further comprises an inverter coupled to a gate of a PMOS transistor.

Optionally, the pull-up device comprises a PMOS transistor.

Optionally, the common bias circuit comprises a transistor coupled between a power source and a variable current source.

Optionally, the bias voltage from the common bias circuit is tunable based on a digital code from a storage device.

Optionally, the storage device comprises a register, a SRAM, or an e-fuse.

Optionally, the storage device is a part of the common bias circuit.

Optionally, the common bias circuit comprises a variable current source, the variable current source having an input for receiving data to tune the bias voltage.

Optionally, the bias voltage is tunable to control a strength of the half-latch circuit.

Optionally, the common bias circuit is coupled to the pull-up device and an additional pull-up device.

An integrated circuit comprising the interconnect element, and an additional interconnect element.

Optionally, the integrated circuit comprises a programmable logic device.

A method of tuning a strength of a pull-up device in one of a plurality of interconnect elements, includes: providing a common bias circuit; and transmitting a tunable bias voltage from the common bias circuit to the pull-up device to adjust the strength of the pull-up device.

Optionally, the method further includes generating the tunable bias voltage by the common bias circuit based on a digital code stored in a storage device.

Optionally, the common bias circuit comprises a variable current source, and wherein the method further comprises using the digital code to adjust a current of the variable current source.

Optionally, the common bias circuit also includes a transistor, and wherein the method further comprises adjusting a voltage from gate-to-source (VGS) of the transistor in response to the adjusted current of the variable current source.

Optionally, the method further includes determining the digital code, wherein the digital code is determined after an integrated circuit including the pull-up device has been manufactured.

Optionally, the digital code is determined by testing the integrated circuit until a desired yield and/or write margin has been achieved.

Optionally, the method further includes transmitting the tunable bias voltage from the common bias circuit to an additional pull-up device to adjust a strength of the additional pull-up device.

Other features and benefits will be described in the detailed description.

BRIEF DESCRIPTION OF THE DRAWINGS

The drawings illustrate the design and utility of some features, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings are not to be considered limiting in the scope of the claims.

FIG. 1-2 illustrates an interconnect element of FIG. 1-1.

FIG. 2 illustrates an interconnect element having a half-latch circuit.

DETAILED DESCRIPTION

Figure 1:
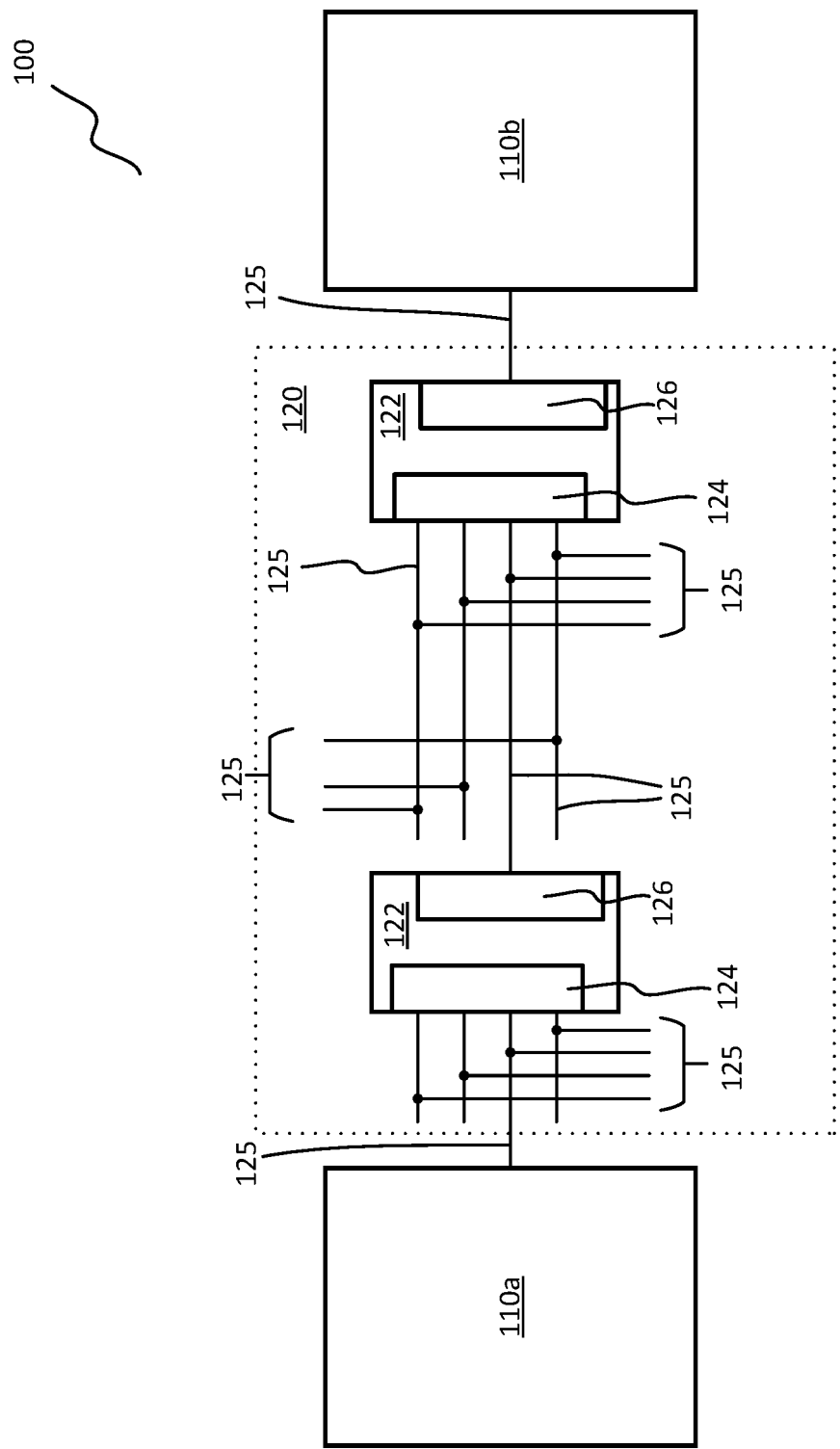
FIG. 1-1 is a block diagram illustrating an interconnect network between logic elements in a programmable logic device.

Various features are described hereinafter with reference to the figures. It should be noted that the figures are not drawn to scale and that the elements of similar structures or functions are represented by like reference numerals throughout the figures. It should be noted that the figures are only intended to facilitate the description. They are not intended as an exhaustive description of the claimed invention or as a limitation on the scope of the claimed invention. In addition, an illustrated item need not have all the aspects or advantages shown. An aspect or an advantage described in conjunction with a particular item is not necessarily limited to that item and can be practiced in any other items even if not so illustrated.

For interconnections between logic elements, FPGAs may offer several types of interconnect depending on the distance between the logic elements that are to be connected. In some examples, multiplexer architectures may be used to implement programmable interconnect of FPGAs. Such multiplexer architectures may include a half-latch circuit, also called a bus keeper, at the output of the multiplexer to retain the state of interconnect wires. The half-latch circuit may maintain the output of the multiplexer at logic voltage levels to avoid high contention current in its driver when the multiplexer is unused. However, when the multiplexer is in use, the half-latch circuit has to be weak enough to pass on logic signals to logic elements or interconnect. Thus, in some cases, it may be desirable to have a multiplexer architecture with a weak half-latch circuit.

FIG. 1-1 illustrates portions of an interconnect network between logic elements in a programmable logic device 100. In some cases, the programmable logic device 100 may be a FPGA. In other cases, the programmable logic device 100 may be other types of logic device that is programmable. In other cases, the device 100 does not need to be a programmable logic device, and may instead be a circuit, such as an integrated circuit. As shown in the figure, the programmable logic device 100 comprises logic elements 110a and 110b, and an interconnect network 120 provided between logic elements 110a and 110b. The logic elements 110a/110b and the interconnect network 120 may be programmed by loading a stream of configuration bits into internal configuration memory cells, wherein the configuration bits define how the programmable logic elements 110a, 110b and/or the interconnect in the programmable logic device 100 are to be configured. Although FIG. 1-1 only shows two logic elements 110a and 110b, it is understood that a plurality of logic elements may be provided in a programmable logic device.

The interconnect network 120 comprises a network of lines 125 of various lengths interconnected by a plurality of interconnect elements 122. In one embodiment, the network of lines 125 runs horizontally and vertically in rows and columns between the logic elements 110a/110b and/or the interconnect elements 122. Each interconnect element 122 includes a selection circuit 124 and a half-latch circuit 126. Although two interconnect elements 122 are shown, it some cases, the programmable logic device 100 may include more than two interconnect elements 122. Also, in some cases, the programmable logic device 100 may include a plurality of interconnect elements 122 arranged in rows and columns.

Figures 1, 2:
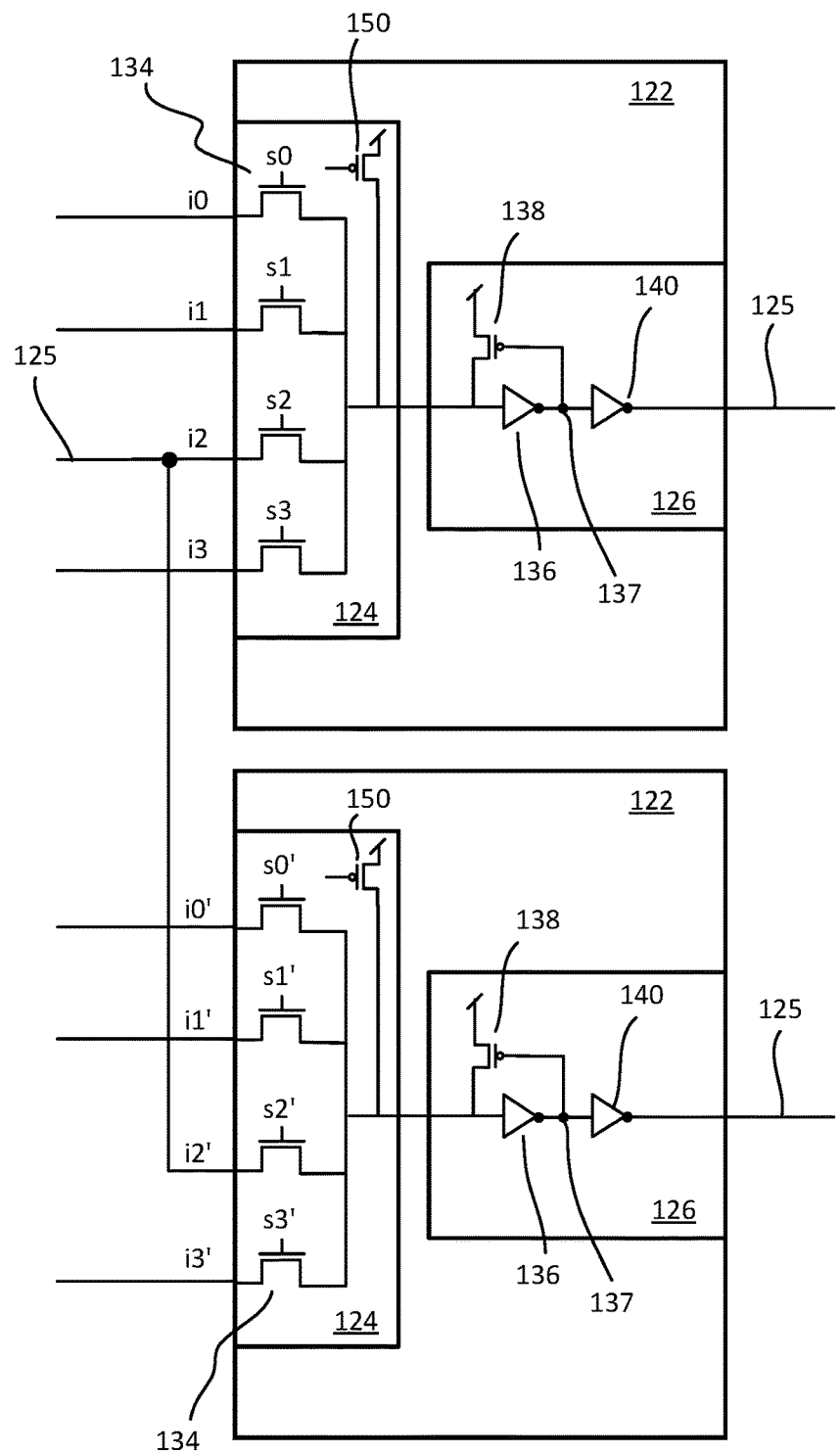
Figure 2:
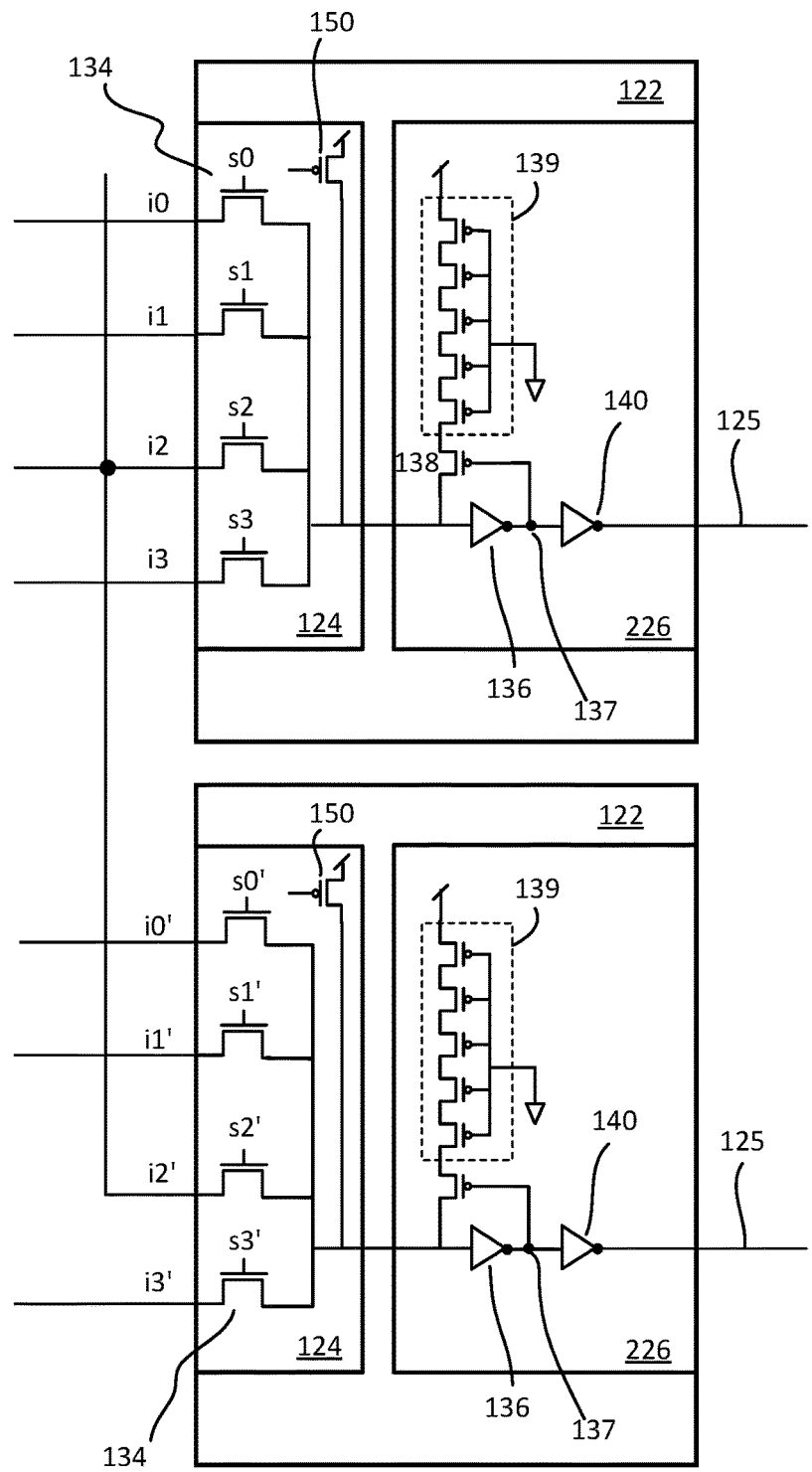

With reference to FIG. 1-2, each interconnect element 122 comprises a selection circuit 124 and a half-latch circuit 126. The selection circuit 124 is configured by configuration memory cells to determine the connections between various points in the programmable logic device 100. In some cases, the selection circuit 124 is used to select one of several output signals from a logic element and pass the selected signal to an interconnect line. In other cases, the selection circuit 124 is used to select a signal from one of several interconnect lines and pass the selected signal to a logic element. As shown in FIG. 1-2, the selection circuit 124 is a multiplexer including four NMOS pass transistors 134 receiving respective data input signals (i0, i1, i2, i3) provided from an output of a logic element (or from one of the interconnect lines). The four NMOS pass transistors 134 are controlled by corresponding select inputs (s0, s1, s2, s3) that originate from the configuration memory cells (not shown). The selection circuit 124 of FIG. 1-2, which is a four-to-one multiplexer, is shown by way of example. However, it should be understood that two-to-one, eight-to-one or other selection circuits could be implemented for selecting an input signal. In addition, while NMOS pass transistors are illustrated in FIG. 1-2, in other embodiments, other types of selection circuits may be used for the selection circuit 124, such as CMOS gates, NAND gate trees, or any combination of the foregoing.

As shown in FIG. 1-2, each selection circuit 124 also includes a component 150. The component 150 (e.g., a PMOS transistor) is used to receive a reset signal (at the gate of the PMOS transistor) to reset the output of the selection circuit 124 to a defined logic state during a power-on period. When a device is powered on, a supply voltage VDD for the device rises from zero to a pre-defined voltage. During this period, logic states at the output of the multiplexers are unknown because they may carry logic memories from previous logic states. Unknown internal logic states may cause unpredictable behaviors in the device and prevent the device from performing its intended functions. Thus, the component 150 is employed for resetting the logic state at the multiplexer output to a defined state.

As shown in FIG. 1-2, the half-latch circuit 126 is coupled to the output of the selection circuit 124. The half-latch circuit 126 comprises an inverter 136 and a PMOS transistor 138 with its gate coupled to the inverter 136 at a node 137. The half-latch circuit 126 also includes a driver 140. In other cases, the driver 140 may be separate from the half-latch circuit 126. It is noted that when a high logic input signal is input through the selection circuit 124, the NMOS pass transistors 134 of the selection circuit 124 may reduce the high logic input signal by approximately $V_{TN}$, the threshold voltage of the pass transistor. This results in a "weak" high logic input signal to the half-latch circuit. The PMOS transistor 138 (i.e., a keeper transistor) is thus provided to pull up a weak high logic input signal to the full high logic voltage of $V_{DD}$. In one embodiment, the inverter 136 is a CMOS inverter including a pull-up path built of a PMOS transistor and a pull-down path built of a NMOS transistor. In addition to the section circuit 124 and the half-latch circuit 126, the interconnect element 122 comprises a driver 140 coupled to the node 137 in the half-latch circuit 126. The driver 140 is used to transmit a selected signal down one of the wires 125 to other logic element(s). The driver 140 may be made up of one or more buffers connected in series. In one embodiment, the buffer 140 is a CMOS inverter. With the half-latch circuit 126, it helps to maintain the output of the selection circuit 124 at logic voltage levels to avoid high contention current in the driver 140 when the interconnect element 122 is unused.

In order to maintain a good write margin (e.g., capability of passing on logic signals to logic elements or interconnect), the pull-up path in the half-latch circuit needs to be weak compared to the pull-down path of the wire. In particular, the strength of the pull-up/pull-down refers to the drive strength that is the current sourcing capability or sinking capability. Thus, in some cases, the pull-up path is considered weaker compared to the pull-down path when the pull-up of the half-latch circuit has less current sourcing capability compared to current sinking capability of the pull-down. In one implementation, the pull-up path may be made weaker by using a plurality of transistors (e.g., 2, 3, 4, 5, 6, 7, 8, 9, 10, etc., transistors) arranged in series. It is noted that the interconnect wire (such as the wire 125) between one driver at the logic element's output and an interconnect element 122 (or between two interconnect elements) may be as long as a few hundred microns. A long interconnect wire makes the pull-down path weaker due to the higher resistance of the wire. Also, additional fan-outs provided by forking an output wire to different interconnect elements may make the pull-up path stronger. Due to the long interconnect wire and the multiple fan-outs, the pull-up path in the half-latch circuit may not be weak enough, thus affecting writability to pass logic LOW signals. Failure to pass logic LOW signals may result in lowering the product yield.

One technique to make the pull-up path in the half-latch circuit weaker is to add a stack of devices in the pull-up path. FIG. 2 illustrates an interconnect element having such a half-latch circuit. Similar to the half-latch circuit 126 of FIG. 1-2, the half-latch circuit 226 of FIG. 2 comprises an inverter 136, a PMOS transistor 138, and a driver 140. Each half-latch circuit 226 of FIG. 2 further comprises a stack of PMOS transistors 139 coupled in series to the transistor 138 to reduce the strength of the half-latch circuit 226. Although five transistors 139 are shown, in other cases, there may be fewer or more than five transistors 139. In some implementation, it may require 10 stacked transistors 139 for every 10 nm interconnect wire to make the half-latch pull-up path weak enough. While the addition of the transistors 139 may make the pull-up path weaker, this configuration may suffer area penalty due to the stacked transistors 139.

Embodiments of the present disclosure implement an interconnect element comprising a half-latch circuit that provides healthy write margin and saves significant amounts of valuable areas or footprint. In addition, embodiments of the present disclosure also provide the feasibility to tune the strength of the half-latch circuit.

Figure 3:
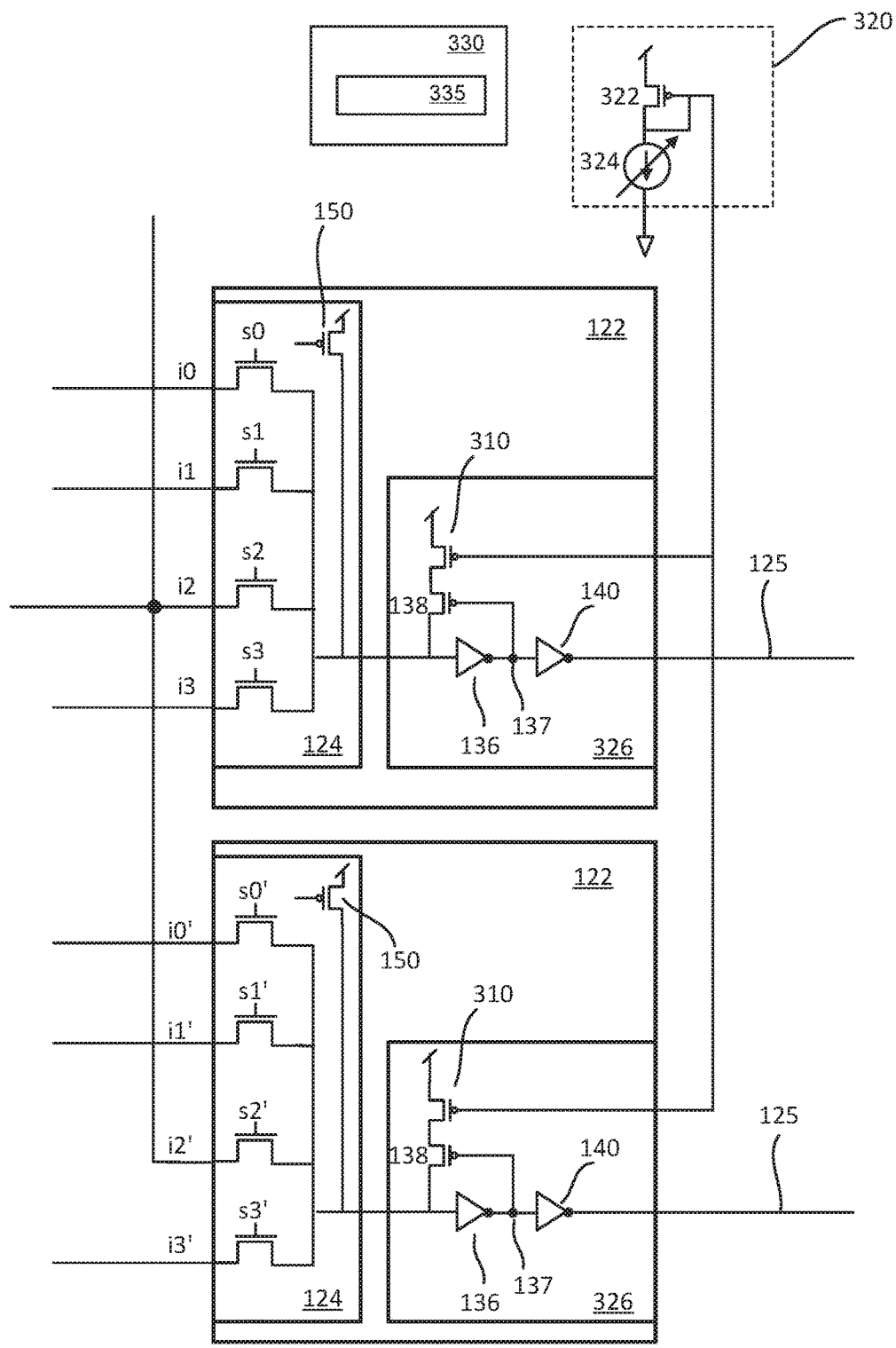
FIG. 3 illustrates an interconnect element having a half-latch circuit.

FIG. 3 illustrates another interconnect element having a half-latch circuit according to some embodiments. Similar to the half-latch circuit 126 of FIG. 1-2, the half-latch circuit 326 of FIG. 3 comprises an inverter 136, a PMOS transistor 138 with its gate coupled to the inverter 136 at a node 137, and a driver 140 for providing outputs of the interconnect element 122. Each half-latch circuit 326 of FIG. 3 further comprises a pull-up device 310 (e.g., a PMOS transistor) with its source coupled to power source ($V_{DD}$) and its drain coupled to the source of the transistor 138. In addition, the gate of the pull-up device 310 is supplied with a tunable bias voltage provided from a common bias circuit 320. The common bias circuit 320 is configured to supply the tunable bias voltage to one or more pull-up devices 310. In one embodiment, the supplied bias voltage may be tuned/trimmed using a storage device 330 (e.g., a register, SRAM, e-fuse, etc.) that stores a digital code 335 for controlling the current source. This tuning/trimming may be performed after the circuit has been manufactured, by providing the digital code from the storage device to the common bias circuit 320. In some cases, the storage device may be a part of the common bias circuit 320 (e.g., coupled to, or in the variable current source 324). In other cases, the storage device may be outside the common bias circuit 320. In some embodiments, the common bias circuit 320 comprises a transistor 322 with its source coupled to $V_{DD}$ and its drain coupled to a variable current source 324. The bias voltage provided to the pull-up devices 310 can be adjusted by tuning the variable current source 324. By controlling the bias voltage supplied from the common bias circuit 320 to the gate of the pull-up device 310, the strength of the pull-up path in the half-latch circuit 326 can be tuned.

For example, if it is desirable to make the pull-up device 310 weaker (to reduce a strength of the pull-up device 310) to improve yield and/or write margin after manufacturing, the current in the variable current source 324 may be adjusted by changing a digital code stored in the storage device (e.g., register, SRAM, e-fuse, etc.) which stores the digital code for controlling the common bias circuit 320 (e.g., the current source 324 therein). When current in the current source 324 is reduced, the VGS (voltage from gate to source) of the transistor 322 reduces. This reduction in current will be reflected in the current of the pull-up device 310 (as the gates of the pull-up device 310 and the transistor 322 are connected, and the source of these components is at the same supply level). So the reduction in variable current source leads to a reduction in the current of the pull-up device 310. Similarly, a increase in variable current source will lead to an increase in the current of the pull-up device 310. Thus, a similar technique may be employed to increase the strength of the pull-up device 310. The inverter 136, the PMOS transistor 138, and the transistor 140 do not play a role in the tuning. However, after the tuning, the delay of the path of these components will depend on the current capability of the pull-up device 310, which is affected by the tuning.

As discussed, the storage device (e.g., SRAM, register, e-fuse, etc.) holds digital code (or data) which decides the tunable bias voltage provided from the common bias circuit 320 to thereby affect the strength of the pull-up devices 322, 310. In some cases, there may be an initial code (data) that was decided based on simulation performed during a design stage. Later, this initial code may be updated after the device has been manufactured by testing the device with different codes. After finding the code required to achieve desired yield and/or write margin, the code (updated code) may then be programmed into the storage device. The storage device provides this updated code to the common bias circuit 320 to thereby adjust the strength of the pull-up devices 322, 310. In one implementation, the current source 324 of the common bias circuit 320 comprises a digital-to-analog convertor, and the current source 324 is controlled by digital input. Accordingly, the digital code from the storage device may be used to change the current in the variable current source 324. This trimming technique helps to improve yield and/or write margin even after manufacturing, and may be used to address any change in the manufacturing process, or simulation models that do not match to the manufacturing process.

In other embodiments, instead of using a storage device (e.g., a register, SRAM, e-fuse, etc.) to provide a digital code to control the current source 324, the current source 324 may be coupled to an interface that allows a user to adjust the current in the current source 324, which in turn, controls the tunable bias voltage provided by the common bias circuit 320.

As illustrated, one common bias circuit 320 can be used for multiple half-latch circuits 326 in corresponding interconnect elements 122. Thus, the area required for an interconnect element is significantly reduced. Also, the half-latch circuit 326 requires less area compared to the configuration of the half-latch circuit 226 described previously. In addition, the feasibility to tune the strength of the pull-up path allows the half-latch circuit to manage the changes in technologies/processes and/or wire length due to architecture updates. Thus, architecture of a product family can be updated and wider blocks can be included in product platform even after an initial tape-out. It is noted that while only one common bias circuit 320 is illustrated in FIG. 3, in some embodiments, more than one common bias circuit may be used in an interconnect network in a programmable logic device.

Figure 4:
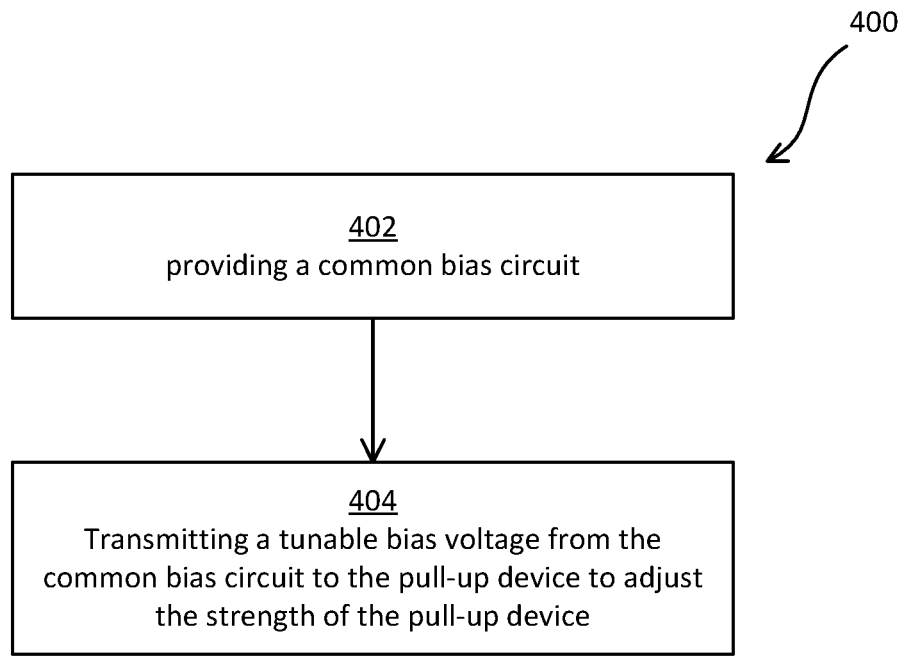
FIG. 4 illustrates a method of implementing an interconnect network for a programmable logic device.

FIG. 4 illustrates a method 400 of tuning a strength of a pull-up device in an interconnect element. The method 400 includes providing a common bias circuit (item 402), and transmitting a tunable bias voltage from the common bias circuit to the pull-up device to adjust the strength of the pull-up device (item 404). In some cases, the method 400 may further include generating the tunable bias voltage by the common bias circuit based on a digital code stored in a storage device.

In one implementation, the digital code may be determined by performing testing and/or simulation after an integrated circuit having the pull-up device is manufactured. After the code required to achieve a desired performance result (e.g., desired yield, write margin, or a combination of the foregoing), the code is then stored (e.g., programmed) into a storage device, such as SRAM, a register, an e-fuse, etc.

Also, in some embodiments, the common bias circuit may include a variable current source (like the variable current source 324 described with reference to FIG. 3), and the method 400 may further include using the digital code to adjust a current of the variable current source. Furthermore, in some cases, the common bias circuit also includes a transistor (like the transistor 322 described with reference to FIG. 3), and the method 400 may further include adjusting a voltage from gate-to-source (VGS) of the transistor in response to the adjusted current of the variable current source.

In some embodiments, the common bias circuit may be communicatively coupled to an additional pull-up device. In such cases, the method 400 may further include transmitting the tunable bias voltage from the common bias circuit to an additional pull-up device to adjust a strength of the additional pull-up device.

Figure 5:
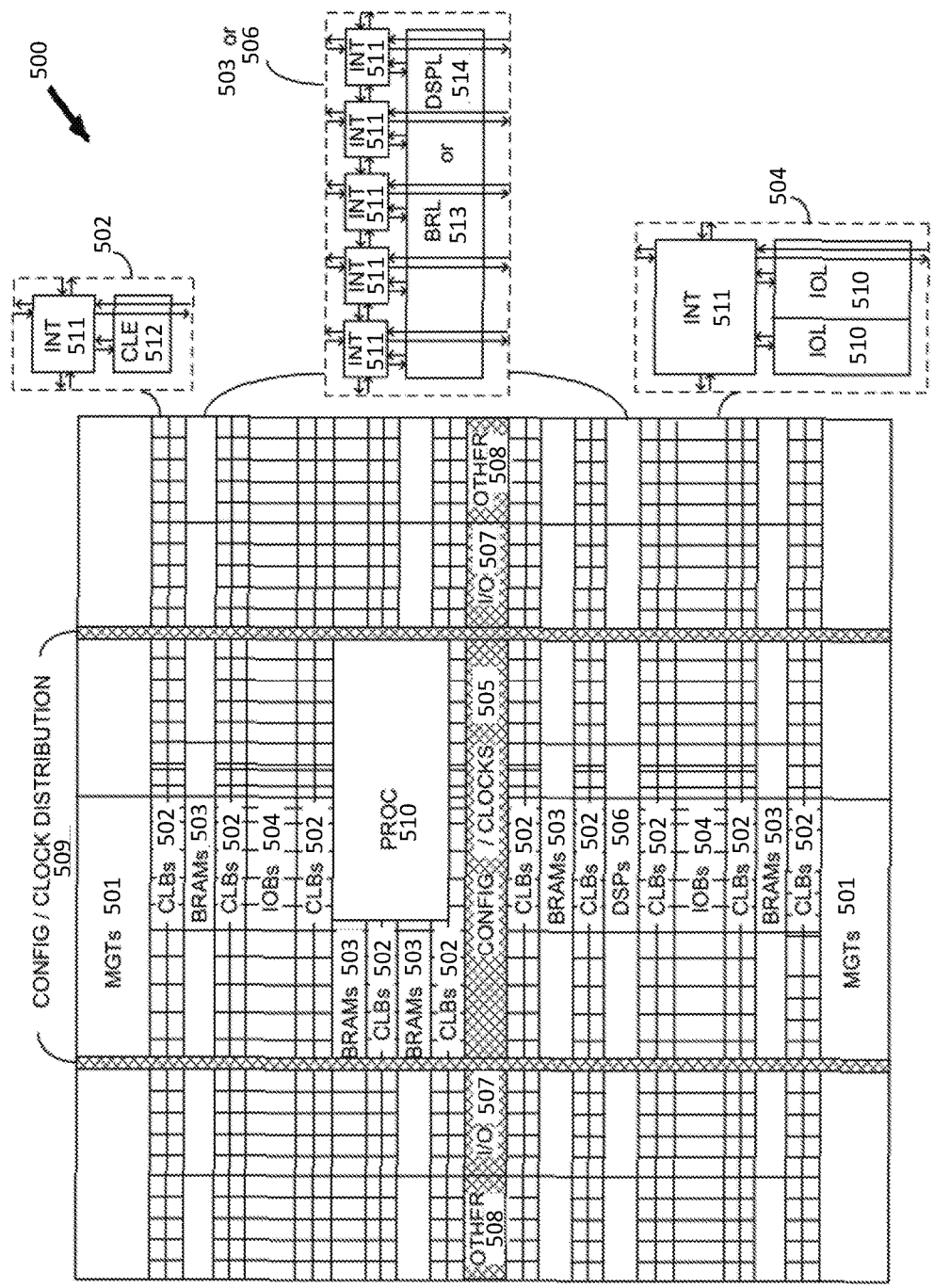
FIG. 5 illustrates an FPGA architecture with which one or more embodiments described herein may be implemented.

FIG. 5 illustrates a diagram of an exemplary programmable logic device architecture 500 that may incorporate interconnect elements with the half-latch circuit as described above. The architecture 500 will be described as a FPGA architecture, but it should be understood that other types of architecture may be used to implement features described herein. The FPGA architecture 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some FPGAs also include dedicated processor blocks (PROC) 510 and internal and external reconfiguration ports (not shown).

In some FPGAs, each programmable tile includes a programmable interconnect element (INT) 511 as described above that has standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile. For example, a CLB 502 can include a configurable logic element CLE 512 that can be programmed to implement user logic plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An IOB 504 can include, for example, two instances of an input/output logic element (IOL) 515 in addition to one instance of the programmable interconnect element INT 511.

In the embodiment illustrated in FIG. 5, an area near the center of the die (shown shaded in FIG. 5) is used for configuration, clock, and other control logic. Areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

PROC 510 can be implemented as a hard-wired processor that is fabricated as part of the die that implements the programmable circuitry of the IC. PROC 510 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 510 can include one or more cores, e.g., central processing units, cache memories, a memory controller, unidirectional and/or bidirectional interfaces configurable to couple directly to I/O pins of the programmable IC and/or couple to the programmable circuitry of the programmable IC. The phrase "programmable circuitry" can refer to the various programmable or configurable circuit blocks or tiles described herein, as well as the interconnect circuitry that selectively couples the various circuit blocks, tiles, and/or elements according to configuration data that is loaded into the IC. In an embodiment, the programmable circuitry also can be implemented as, or called, a programmable fabric.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:
1. An interconnect element, comprising:
a selection circuit for receiving input signals and having a selection output;
a half-latch circuit having an input coupled to the selection output, wherein the half latch circuit comprises a pull-up device; and
a common bias circuit coupled to the pull-up device, wherein the common bias circuit comprises a transistor coupled between a power source and a variable current source, and wherein the common bias circuit is configured to supply a tunable bias voltage to the pull-up device.

2. The interconnect element of claim 1, wherein the selection circuit comprises a multiplexer.

3. The interconnect element of claim 1, wherein the half-latch circuit further comprises an inverter coupled to a gate of a PMOS transistor.

4. The interconnect element of claim 1, wherein the pull-up device comprises a PMOS transistor.

5. The interconnect element of claim 1, wherein the bias voltage from the common bias circuit is tunable based on a digital code from a storage device.

6. The interconnect element of claim 5, wherein the storage device comprises a register, a SRAM, or an e-fuse.

7. The interconnect element of claim 5, wherein the storage device is a part of the common bias circuit.

8. The interconnect element of claim 1, wherein the variable current source having an input for receiving data to tune the bias voltage.

9. The interconnect element of claim 1, wherein the bias voltage is tunable to control a strength of the half-latch circuit.

10. The interconnect element of claim 1, wherein the common bias circuit is coupled to the pull-up device and an additional pull-up device.

11. An integrated circuit comprising the interconnect element of claim 1, and an additional interconnect element.

12. The integrated circuit of claim 11, wherein the integrated circuit comprises a programmable logic device.

13. A method of tuning a strength of a pull-up device in one of a plurality of interconnect elements, comprising:
providing a common bias circuit, wherein the common bias circuit comprises a variable current source and a transistor;
adjusting the variable current source using a digital code stored in a storage device;
adjusting a voltage from gate-to-source (VGS) of the transistor in response to the adjusted current of the variable current source;
generating a tunable bias voltage by the common bias circuit based on the digital code; and
transmitting the tunable bias voltage from the common bias circuit to the pull-up device to adjust the strength of the pull-up device.

14. The method of claim 13, further comprising determining the digital code, wherein the digital code is determined after an integrated circuit including the pull-up device has been manufactured.

15. The method of claim 14, wherein the digital code is determined by testing the integrated circuit until a desired yield and/or write margin has been achieved.

16. The method of claim 13, further comprising transmitting the tunable bias voltage from the common bias circuit to an additional pull-up device to adjust a strength of the additional pull-up device.

* * * * *